(12) United States Patent
Cheah et al.

(10) Patent No.: US 7,728,420 B2
(45) Date of Patent: Jun. 1, 2010

(54) HIGH CURRENT LEAD ELECTRODE FOR SEMICONDUCTOR DEVICE

(75) Inventors: Chuan Cheah, Redondo Beach, CA (US); Kunzhong Hu, Santa Monica, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 12/001,016

(22) Filed: Dec. 7, 2007

(65) Prior Publication Data

US 2008/0237829 A1    Oct. 2, 2008

Related U.S. Application Data

(60) Provisional application No. 60/873,322, filed on Dec. 7, 2006.

(51) Int. Cl.
*H01L 23/48* (2006.01)
(52) U.S. Cl. .................. 257/690; 257/686; 257/673; 257/734; 257/735; 257/E23.039; 257/E23.042
(58) Field of Classification Search ............... 257/690
See application file for complete search history.

(56) References Cited

U.S. PATENT DOCUMENTS 5,159,434 A * 10/1992 Kohno et al. ............... 257/676
6,175,151 B1 * 1/2001 Hashimoto ................. 257/676
7,122,884 B2 * 10/2006 Cabahug et al. ............ 257/676

* cited by examiner

*Primary Examiner*—Jasmine J Clark
(74) *Attorney, Agent, or Firm*—Farjami & Farjami LLP

(57) ABSTRACT

A semiconductor package that includes a lead frame riveted to pillars electrically connect to an electrode of a semiconductor die.

14 Claims, 1 Drawing Sheet

HIGH CURRENT LEAD ELECTRODE FOR SEMICONDUCTOR DEVICE

RELATED APPLICATION

This application is based on and claims benefit of U.S. Provisional Application Ser. No. 60/873,322, filed on Dec. 7, 2006, entitled High Current Lead Electrode for Semiconductor Device, to which a claim of priority is hereby made and the disclosure of which is incorporated by reference.

FIELD OF THE INVENTION

This invention relates to semiconductor devices and more specifically relates to a novel structure and process for attaching high current capacity leads to semiconductor device electrodes.

BACKGROUND OF THE INVENTION

Power semiconductor die such as diodes, MOSFETs and the like usually comprise a silicon, GaN, or other die having electrodes such as source, drain, emitter, collector, anode or cathode electrodes on at least one surface for connecting the device to pads on a circuit board. These electrodes, which conventionally are aluminum or the like, are usually coupled to pads of a circuit board by a solder or the like. However, there is a limit to the current which a solder joint or wire bond can safely conduct due to the limited cross-sectional area and thermal capacity of the connection and the consequent limited current density in the connection structure.

BRIEF DESCRIPTION OF THE INVENTION

In accordance with the invention, a copper lead frame, or laminate substrate or other substrate is riveted directly to the electrode of a power die. More specifically, a redistributed metal layer is connected to each electrode of the power die. Spaced copper pillars are then grown or bumped on each redistributed metal layer. A thick lead frame with openings at the pillar or bump locations is then fitted over the pillars and in surface-to-surface contact with each redistributed metal layer such that the tops of the pillars extend above the upper surface of the lead frame. The tops of the pillars are then peened over, or formed over in the manner of a rivet head by application of ultrasonic energy along with thermal energy and/or pressure to rivet each lead frame to a respective set of pillars, whereby each lead frame is connected to a respective electrode of the power semiconductor die.

DETAILED DESCRIPTION OF THE PREFERRED EMBODIMENT

Figure 1:
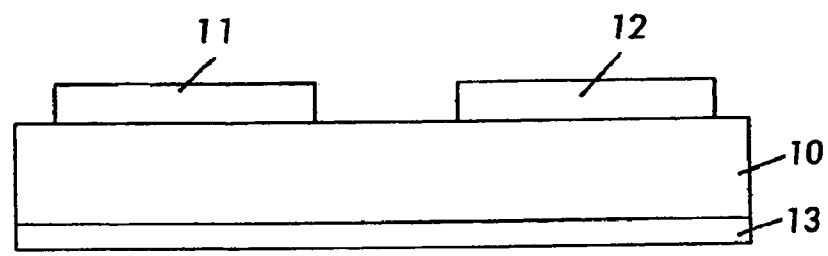
FIG. 1 is a cross section of a semiconductor die of any desired type (e.g. a MOSFET or a high electron mobility transistor) having two electrodes, for example, source and drain electrodes.
Figure 2:
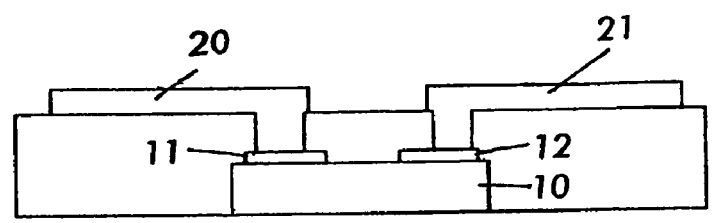
FIG. 2 shows the structure of FIG. 1 after the application of a redistributed pad, preferably of copper, fixed to the electrodes, and with bump-type parallel, spaced copper pillars formed on the redistributed pad.
Figure 3:
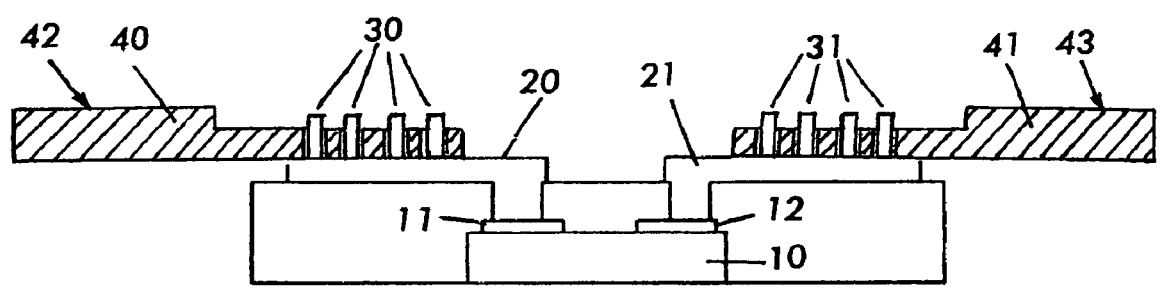
FIG. 3 shows the placement of a lead frame with openings which receive the pillars of FIG. 2.

FIG. 1 shows a semiconductor die 10, which may be a MOSFET having spaced power electrodes 11 and 12 which may be source or drain terminals. The gate terminal is not shown. A bottom metallization 13 is also shown. Electrodes 11 and 12 are commonly aluminum and are connected to wire bonds or the like. It is desired to provide a higher current density capacity connection to these electrodes.

In accordance with the invention, large area redistributed pads 20, 21, formed preferably of copper, are suitably conductively attached to electrodes 11 and 12 respectively. Note that redistributed pads 20 may be fabricated according to U.S. patent application Ser. No. 11/592,408, (incorporated by this reference), entitled Semiconductor Package With redistributed Pads, filed on Nov. 3, 2006, and assigned to the assignee of the present application or U.S. patent application Ser. No. 11/595,206 (incorporated by this reference), entitled Semiconductor Package Including A Semiconductor Die Having Redistributed Pads, filed on Nov. 10, 2006, and assigned to the assignee of the present application.

A plurality of spaced, parallel, upstanding pillars 30 and 31, are then formed on pads 20 and 21 respectively, using a conventional bumping process.

Conductive lead frames 40 and 41 of thickness less than the height of pillars 30 and 31 are provided with openings at locations corresponding to the locations of the individual pillars 30 and 31. The shape of the openings in frames 40 and 41 may correspond to the cross-sectional shape of the pillars with sufficient clearance to fit easily over the pillars. For example, if the pillars are circular or rectangular in cross-section, then the openings are circular or rectangular respectively. Note that each lead frame includes an open surface 42, 43 for external electrical connection.

Figure 4:
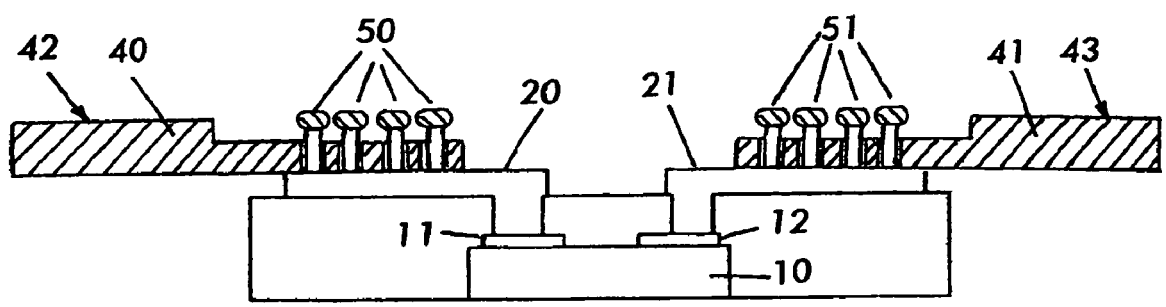
FIG. 4 show the pillars of FIG. 3 formed with rivet heads to fix the lead frames in intimate current connection with the redistributed pads and providing easy connection terminals for the die.

The tops of pillars 30 and 31 projecting over the top of lead frames 40 and 41 are then peened over the top of lead frames 40, 41 to form rivet heads 50 and 51 for each pillar (FIG. 4) in order to securely attach lead frames 40 and 41 to pads 20 and 21 respectively, forming a low electrical and thermal resistance connection to electrodes 11 and 12, respectively. To peen the tops of pillars 30, 31 ultrasonic energy with heat and/or pressure may be employed.

The lead frames 40 and 41 then define easily connectable electrodes for the device.

A package according to the present invention, allows for a much greater current density. Further, the process eliminates an inner solder attach and avoids inter-metallic formation. Further, it provides a faster and less expensive assembly process.

Note that, while a gate electrode is not specifically discussed herein, a gate electrode of a semiconductor die may similarly receive a lead frame according to the present invention.

Furthermore, while the preferred embodiment calls for a lead frame formed of a single piece of metal (e.g. a slab of copper or the like), a laminated substrate may be used instead of a lead frame without deviating from the scope and spirit of the present invention.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A power semiconductor package, comprising:

a semiconductor device;

at least one electrode on a surface of said semiconductor device;

a lead frame including a first surface and a second surface opposite said first surface, and an opening having a first mouth at said first surface and a second mouth at said second surface; and a conductive pillar electrically coupled to said one electrode at one end thereof, extending through said opening, and having a rivet head at another opposing end thereof, said rivet head being peened and disposed over said second surface of said lead frame.

2. The package of claim 1, wherein said conductive pillar is comprised of copper.

3. The package of claim 1, wherein said pillar extends from a redistributed pad electrically coupled to said at least one electrode.

4. The package of claim 1, wherein said lead frame includes a surface for external electrical connection.

5. The package of claim 1, wherein said lead frame is comprised of a single piece of metal.

6. The package of claim 1, wherein said lead frame is comprised of a laminated substrate.

7. The package of claim 1, wherein said at least one electrode is one of a source electrode, a drain electrode and a gate electrode.

8. A power semiconductor package, comprising:

a semiconductor device;

a plurality of electrodes on a surface of said semiconductor device;

a first lead frame including a first surface and a second surface opposite said first surface, and a plurality of openings each having a first mouth at said first surface and a second mouth at said second surface;

a plurality of first conductive pillars each electrically coupled to one of said electrodes at one end thereof, extending through said openings in said first lead frame, and having a rivet head at another opposing end thereof, said rivet head peened over said second surface of said first lead frame;

a second lead frame including a first surface and a second surface opposite said first surface, and a plurality of openings each having a first mouth at said first surface and a second mouth at said second surface; and a plurality of second conductive pillars each electrically coupled to another of said electrodes at one end thereof, extending through said openings in said second lead frame, and having a rivet head at another opposing end thereof, said rivet head peened over said second surface of said second lead frame.

9. The package of claim 8, wherein said conductive pillars are comprised of copper.

10. The package of claim 8, wherein each said pillar extends from a respective redistributed pad electrically coupled to at least one of said electrodes.

11. The package of claim 8, wherein each said lead frame includes a surface for external electrical connection.

12. The package of claim 8, wherein each said lead frame is comprised of a single piece of metal.

13. The package of claim 8, wherein each said lead frame is comprised of a laminated substrate.

14. The package of claim 8, wherein each said electrode is one of a source electrode, a drain electrode and a gate electrode.

* * * * *